(12) United States Patent
Arsovski et al.

(10) Patent No.: US 9,583,192 B1
(45) Date of Patent: Feb. 28, 2017

(54) MATCHLINE PRECHARGE ARCHITECTURE FOR SELF-REFERENCE MATCHLINE SENSING

(71) Applicant: GLOBALFOUNDRIES INC., Grand Cayman (KY)

(72) Inventors: Igor Arsovski, Williston, VT (US); Michael T. Fragano, Essex Junction, VT (US); Thomas M. Maffitt, Burlington, VT (US); Robert M. Houle, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/164,325

(22) Filed: May 25, 2016

(51) Int. Cl.
*G11C 15/04* (2006.01)
*G11C 15/00* (2006.01)
*G11C 7/08* (2006.01)
*G11C 7/12* (2006.01)

(52) U.S. Cl.
CPC .............. *G11C 15/04* (2013.01); *G11C 7/08* (2013.01); *G11C 15/00* (2013.01); *G11C 7/12* (2013.01)

(58) Field of Classification Search
CPC ........... G11C 15/00; G11C 15/04; G11C 7/08; G11C 7/12
See application file for complete search history.

(56) References Cited

U.S. PATENT DOCUMENTS

| | | | |
|---|---|---|---|
| 7,751,218 B2 | 7/2010 | Arsovski | |
| 8,687,398 B2 | 4/2014 | Chang et al. | |
| 9,088,277 B2 | 7/2015 | Arsovski et al. | |
| 9,281,023 B2 | 3/2016 | Arsovski et al. | |
| 2012/0206951 A1* | 8/2012 | Rachamadugu | G11C 15/04 365/49.17 |
| 2015/0055389 A1* | 2/2015 | Arsovski | G11C 7/08 365/49.17 |
| 2016/0267963 A1* | 9/2016 | Koike | G11C 7/12 |

OTHER PUBLICATIONS

Arsovski et al., "A Ternary Content-Addressable Memory (TCAM) Based on 4T Static Storage and Including a Current-Race Sensing Scheme", IEEE Journal of Solid-State Circuits, vol. 38, No. 1, Jan. 2003, 4 pages.

* cited by examiner

*Primary Examiner* — Richard Elms
*Assistant Examiner* — Ajay Ojha
(74) *Attorney, Agent, or Firm* — Anthony Canale; Andrew M. Calderon; Roberts, Mlotkowski, Safran, Cole & Calderon, P.C.

(57) ABSTRACT

The present disclosure relates to content addressable memories (CAM), and more particularly, to a searchable CAM structure having self-reference matchline precharge and local feedback control and method of use. The present disclosure includes a structure which includes: a sense line connected to a sensing device; a feedback line connected to the sense line at a tap point between a first end and a second end of the sense line; and a local precharge controller connected to the tap point by the feedback line to control precharging of the sense line according to a state of the feedback line.

20 Claims, 5 Drawing Sheets

MATCHLINE PRECHARGE ARCHITECTURE FOR SELF-REFERENCE MATCHLINE SENSING

FIELD OF THE INVENTION

The present disclosure relates to content addressable memories (CAM), and more particularly, to a searchable CAM structure having self-reference matchline precharge and local feedback control and method of use.

BACKGROUND

Recently, technology scaling (e.g., to sub-100 nm dimensions) has resulted in relatively large random process variations that are incorporated into circuits and, particularly, has resulted in relatively large across chip variations in memory devices, e.g., sensing circuits. To compensate for these variations, sensing circuits typically operate with delays incorporated into the timing of the circuit, which degrades performance.

For example, in a Content Addressable Memory (CAM) each word is associated with a matchline that is precharged at the beginning of the cycle and discharged during the evaluation portion of the cycle if, and only if, the contents of the word mismatches the contents of the input search lines. Consequently the cycle time of the CAM, i.e., the fastest time (at a particular voltage and temperature) that this matching operation can be reliably repeated, is dependent on the precharge time, the evaluation (comparison) time and the time it takes to latch and propagate the results. To allow for statistical variations in manufacturing, each time portion of the overall operation must be carefully designed. Matchline precharge time is determined by generating a global precharge signal applied to a dummy matchline for a precharge time plus a fixed logic delay. Consequently, the precharge time for each matchline is globally fixed with no ability to adjust for precharge time variations from matchline to matchline. This precharge time also has no ability to sense and compensate for variable metal resistance and capacitance thereby forcing the designer to overdesign the various elements.

SUMMARY

In an aspect of the disclosure, a structure includes: a sense line connected to a sensing device which can detect small voltage differences on that sense line that might occur during the evaluation time; a feedback line connected to the sense line at a tap point between a first end and a second end of the sense line; and a local precharge controller connected to the tap point by the feedback line to control precharging of the sense line according to a state of the feedback line.

In an aspect of the disclosure, a structure includes: a global controller to output a global precharge signal; a matchline connected to bit comparison transistors; and a sense amplifier connected to the global controller and the matchline, the sense amplifier comprising a local precharge controller configured to locally precharge the matchline.

In an aspect of the disclosure, a method for determining a match or a mismatch on a matchline includes precharging a matchline connected to a sense amplifier; and turning off the precharging of the matchline according to a charge state of a feedback line connected to the matchline

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
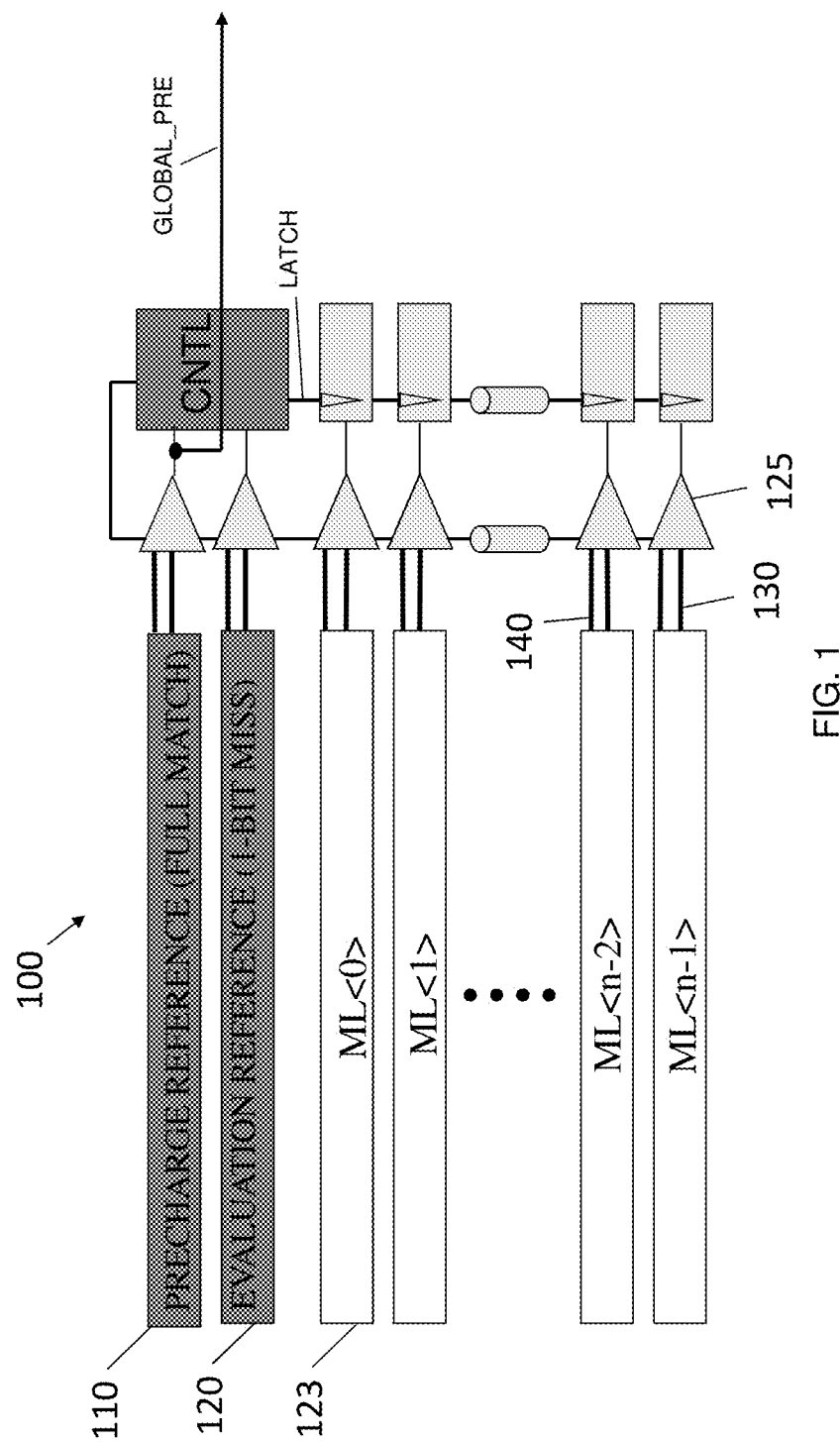
FIG. 1 shows as a CAM structure including sense amplifiers and matchlines in accordance with aspects of the present disclosure.

The present disclosure relates to content addressable memories (CAM), and more particularly, to a searchable CAM structure having self-reference matchline precharge and local feedback control and method of use. More specifically, the present disclosure presents a novel way to monitor and control the matchline precharge time. For example, the present disclosure relates to a sensing device structure which is structured to determine match/mismatch of a matchline or sense line in which the sensing device has a local precharge control over precharge of the matchline or sense line according to a feedback of the charge state of the sense line to the precharge controller. Various embodiments may be applied to a four transistor (4T), six transistor (6T), eight transistor (8T), ten transistor (10T), etc., SRAM cell bit line, a resistive global data line, etc.

Advantageously, the present disclosure provides an improved search performance of the searchable CAM structure by providing local control over the precharge of the individual matchlines, i.e., sense lines, resulting in decreased precharge and evaluate time of all of the matchlines of the CAM structure. In embodiments, the state of the individual matchline of the CAM structure can be fed back into a local precharge controller to control application of a local precharge signal to a transistor controlling access to a voltage source. To improve the search performance, the matchline is tapped at a percentage of its total length from a sense amplifier, i.e., sensing device, and fed back to the sense amplifier to directly measure the precharge level of that matchline and sense amplifier combination, accounting for metal resistance and capacitance, resulting in an overall faster precharge time and consequently a faster overall cycle time.

An aspect of the disclosure is that the precharge time is now controlled by both a global signal and a local signal. The precharge time for all matchlines is initiated by the global precharge control signal but the local control signal will shut-off the precharge when it senses that the individual matchline that it is monitoring is precharged adequately. This allows for an overall faster cycle time because each matchline can start the evaluation portion when it is ready to do so, rather than waiting for the slowest matchline to precharge.

By way of example, in the current state of the art, the cycle time required to ensure that a 5-sigma (9999997 out of 10 million) majority of matchlines complete their operation equals the maximum precharge time+mean evaluation time+ mean latch time+the 5-sigma statistical variation time associated with the evaluation and latch times. With the present disclosure, the cycle time is now equal to the mean precharge time+mean evaluation time+mean latch time+the 5-sigma statistical variation time associated with the precharge, evaluation and latch times, which is statistically faster. The local precharge shut-off control uses feedback from the individual matchline to assess the resistance of the matchline across process voltages and temperatures (PVTs), and makes sure adequate precharge time is provided on each individual sense amplifier/matchline complex. In other words, the feedback of the matchline is used to ensure that the precharge of the matchline is above the threshold of the sense amplifier at precharge completion.

To improve the precharge time, and consequently cycle time, for varying matchline lengths and process sensitivities, the matchline sensing architecture includes the feedback, i.e., matchline tap point, to each sense amplifier to individually set the optimum precharge time. Based on the feedback of the matchline tap point, the precharge time of each matchline may be different and the evaluation period for each matchline may begin immediately upon sufficient matchline precharge.

Since each local sense amplifier sets its own precharge time, the evaluation can start early relative to the global precharge signal, thereby improving performance. For example, a 15% improvement on Tcycle and Taccess of a ternary CAM (TCAM) has been observed according to the self-limiting precharge that tracks PVT and matchline metal according to the present disclosure.

FIG. 1 shows a structure including a sense amplifier and matchline in accordance with aspects of the present disclosure. The structure 100 may be a CAM as described herein. The CAM may be a binary CAM analyzing data search words consisting entirely of 1s and 0s or may be a ternary CAM that allows for a third match state, for example, a wild card, X, or "don't care", for one or more bits in the stored word.

The structure 100 includes a full match precharge dummy matchline 110, an evaluation dummy matchline 120, a global controller CNTL, matchlines 123, and sense amplifiers 125. In embodiments, each matchline 123 is connected to a respective sense amplifier 125 via a connection line 130 and a feedback line 140.

As shown in FIG. 1, a global controller CNTL is connected to an end of the full match precharge dummy matchline 110 and to the end of the 1-bit miss evaluation dummy matchline 120 via a sense amplifier 125. The output of the sense amplifier 125 connected to the full match precharge dummy matchline 110 may be input to each of the sense amplifiers 125 as a global precharge signal GLOBAL_PRE. In embodiments, the global controller CNTL issues a latch signal LATCH to capture all search results and complete the evaluation (comparison) operation, in which the voltage on all matched matchlines 123 would have crossed the threshold of their respective sense amplifiers 125, while the voltage on the mismatched matchlines 123 would have stayed below the threshold of their respective sense amplifiers 125.

Figure 2:
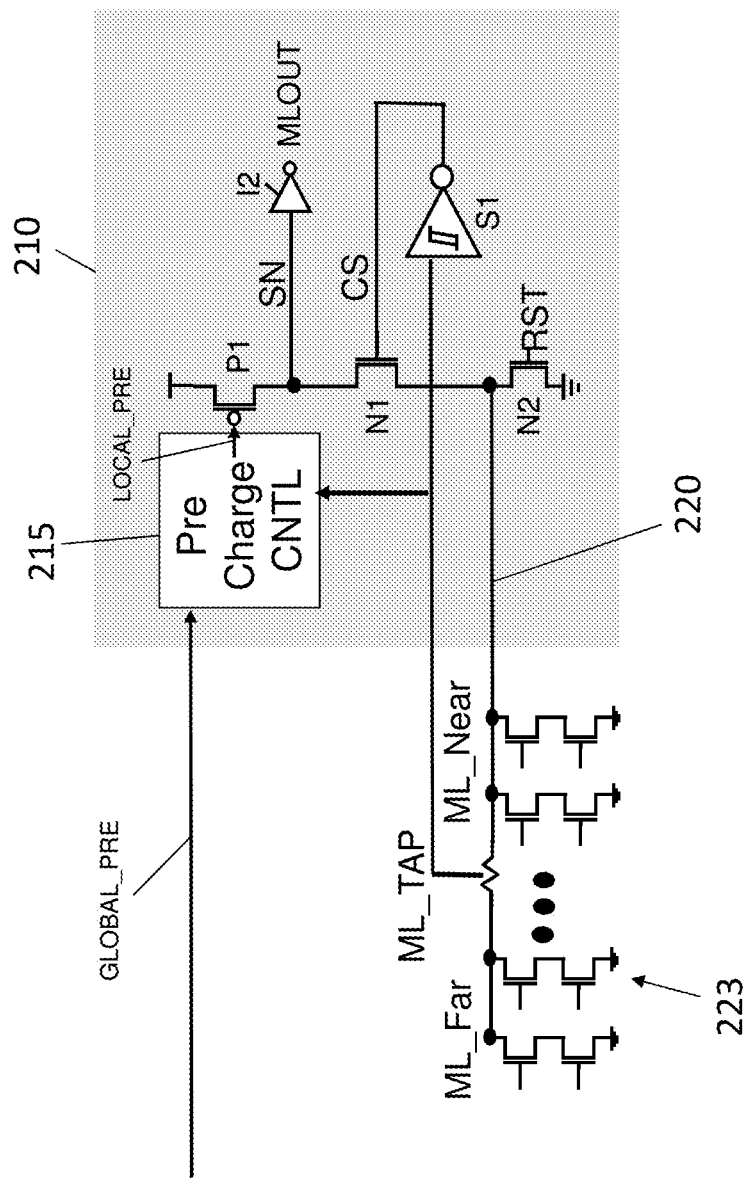
FIG. 2 shows a sense amplifier and a matchline in accordance with aspects of the present disclosure.

FIG. 2 shows a sense amplifier and matchline in accordance with aspects of the present disclosure. The exemplary self-referenced sense amplifier 210 includes a local precharge controller 215, a pFET transistor P1, a sense node SN, and an inverter I2 connected to the sense node SN and generating a matchline output signal MLOUT. The sense amplifier 210, in embodiments, includes an nFET transistor N1, an inverter S1 to control the gate of the nFET transistor N1, a reset nFET transistor N2 controlled by a reset signal RST, and a matchline 220.

In embodiments, the sense amplifier 210 further includes a feedback line ML_TAP connected between the matchline 220, the local precharge controller 215, and the inverter S1. Bit comparison transistors 223 are connected in series between the matchline 220 and a ground. The gates of the bit comparison transistors 223 may be connected to and/or controlled by search lines or storage elements, e.g., a SRAM or DRAM. For example, two bit comparison transistors 223, i.e., a stack, may be connected between the matchline 220 and the ground, and a transistor of the two bit comparison transistors 223 closer to the matchline 220 may be connected to a search line while the other transistor of the bit comparison transistors 223 is connected to a memory element. In embodiments, adjacent stacks of the bit comparison transistors 223 may be connected to parallel search lines. A mismatch between the data stored in the storage element and the data searched results in at least one stack of the bit comparison transistors 223 to be conducting, thereby reducing the charge and voltage level of the matchline 220.

The sense amplifier 210 is coupled to the matchline 220 to determine the state of the matchline 220. The sense amplifier 210 includes the pFET transistor P1 coupled in series to the nFET transistor N1 to connect the matchline 220 to a voltage source. The inverter S1 is coupled to the feedback line ML_TAP connected to the matchline 220. The inverter S1 may be a Schmitt-trigger but need not be so in all aspects of the present disclosure. The output of inverter S1 is fed back to the gate of nFET N1, while the gate of pFET P1 is coupled to the local precharge controller 215. Moreover, the inverter I2 is coupled to a sense node SN connected between pFET P1 and nFET N1 to drive the evaluation result (MLOUT signal) for each matchline.

To improve the search performance, each matchline 220 is tapped at a percentage of its total length from the sense amplifier 210 and fed back directly to the local precharge controller 215 of sense amplifier 210 to measure the precharge level of the tap point. The feedback line ML_TAP may be connected to the matchline 220 anywhere along a length of the matchline 220, and is preferably connected between a far end ML_Far and a near end ML_Near of the matchline 220. The location of the tap point may be provided according to technology dependent parameters, such as metal resistance and capacitance, and may be provided between one end of the matchline and the sense amplifier. In embodiments, for example, the feedback line ML_TAP may be connected to the matchline 220 at about ⅓ to about ½ the length of the matchline 220 from the end of the matchline 220 connected to the nFET transistor N1; although, other connection points are contemplated by the present disclosure.

In operation, the matchline 220 is set to low, e.g., to ground, by a reset signal RST received by the reset nFET transistor N2. The reset transistor N2 is connected to an end of the matchline 220 and the transistor N1. The global precharge signal GLOBAL_PRE is set to high, e.g., to Vdd. The local precharge controller 215 receives the high global precharge signal GLOBAL_PRE and generates a high local precharge signal LOCALPRE to the gate of the pFET transistor P1.

In a precharge mode, the matchline 220 is precharged to the threshold (or trigger point) of the inverter S1, and, thereafter, matchline 220 sensing occurs. To begin precharging the matchline 220 from its initial low, the global controller CNTL controls the global precharge signal GLOBAL_PRE to go low from its initial high. The local precharge controller 215 receives the low global precharge signal GLOBAL_PRE from the global controller and, in response, takes LOCALPRE low, which turns on pFET P1. Operation of the local precharge controller 215 will be described in further detail herein.

Because the matchline 220 and feedback line ML_TAP are initially set low, the gate of nFET N1 is set high by inverter S1, turning on nFET N1. This allows current flow to begin quickly charging matchline 220 and the feedback line ML_TAP to the threshold of inverter S1. When the voltage on the matchline 220 crosses the threshold of inverter S1, inverter S1 will start discharging the gate of nFET N1 low until nFET N1 turns off. As a result, sense node SN, which was originally coupled to matchline 220 through nFET N1, uses the full charge provided by pFET P1 to charge sense node SN to Vdd and the output of inverter I2 is discharged low to GND.

The feedback line ML_TAP is also supplied to the local precharge controller 215 to disable LOCALPRE and locally turn off pFET P1 to allow for the matchline 220 to develop a match or a mismatch while the global precharge signal GLOBAL_PRE remains low, i.e., while the global precharge signal GLOBAL_PRE continues to indicate a precharge mode. The local precharge controller 215 may have a threshold for disabling the LOCALPRE signal higher than the threshold of the inverter S1 so as to ensure that the local precharge controller 215 does not prevent the matchline ML from sufficiently charging for evaluation.

For example, threshold of the inverter S1 and the location of the connection of the feedback line ML_TAP to the matchline 220 allow the matchline 220 to charge long enough to provide sufficient current for the operation of the bit comparison transistors 223 of the far end ML_Far of the matchline 220. Accordingly, the tap point of the feedback line ML_TAP which is located in the matchline 220 advantageously provides sufficient current to the far end ML_Far of the matchline 220 to detect matches and misses upon equalization of the charge along the matchline 220 while also not unnecessarily increasing a length of time of the precharge mode. When the feedback line ML_TAP passes the threshold of the inverter S1, the far end ML_Far of the matchline 220 will have a lower voltage than the near end ML_Near of the matchline 220 but the matchline 220 will equalize at a voltage higher than the threshold necessary for evaluation.

After a period of time, the global controller CNTL may take the global precharge signal GLOBAL_PRE high again to end the global precharge mode to prevent a continuous drain of a mismatched matchline 220 that prevents the matchline 220 from reaching the inverter S1 threshold. After the precharge of the individual matchline 220 is complete, the evaluate mode can then begin for the matchline 220 while the global precharge signal GLOBAL_PRE remains high and before or after other matchlines ML have begun the evaluate mode.

Because each matchline 220 is precharged according to its unique threshold in its own time, there is no need to delay the evaluation mode for the matchline 220 thereby reducing the duration of the precharge mode and improving sense performance. Moreover, an optional keeper can be coupled between the gate of nFET N1 and matchline 220 which can maintain the precharged value to prevent leakage on the matchline 220 from being misinterpreted as a mismatch.

When a match occurs, the bit comparison transistors 223 connected to the matchline 220 act like a simple capacitor such that both the matchline 220 as well as the sense node SN remain precharged, and the output of inverter I2 remains low. Alternatively, when a mismatch occurs, at least one stack of the bit comparison transistors 223 connected to the matchline 220 is conducting and acts like a weak switch to discharge the matchline 220. As a result of the conducting pull-down transistors, the matchline 220 will fall below the threshold voltage of inverter S1, such that the output of inverter S1 will flip to a high state and turn on nFET N1. Turning on nFET N1 discharges sense node SN from its precharged Vdd-level back to the matchline 220 voltage level, causing the output of inverter I2 to go high. To decrease timing uncertainty, the inverter I2 is designed to have a higher trip point than inverter S1. Thus, matches precharge above their sense threshold and remain precharged, while misses precharge above their sense threshold and then discharge. The precharge level and the rate of the discharge depend on how many bits within the memory word mismatch the search bits.

Since all but largely mismatched MLs are precharged to the thresholds of their respective sense amplifiers, the sensing is fast. The matchlines for matches remain at their precharge level until they are reset, whereas the matchlines for misses discharge to ground during the evaluation phase. Due to the self-reference nature of the sense amplifiers and the feedback of the matchline, even though the matchlines exhibit different switching times during precharging, the sense amplifiers trigger upon reaching threshold charge and the local precharge controller ends the local precharge mode to start the evaluate mode on that matchline. Consequently, each sense amplifier 210 determines when its matchline 220 is precharged, allowing the evaluate mode to begin before the global precharge done signal is received. The result is faster search cycle time with improved 1-bit miss statistics.

Figure 3:
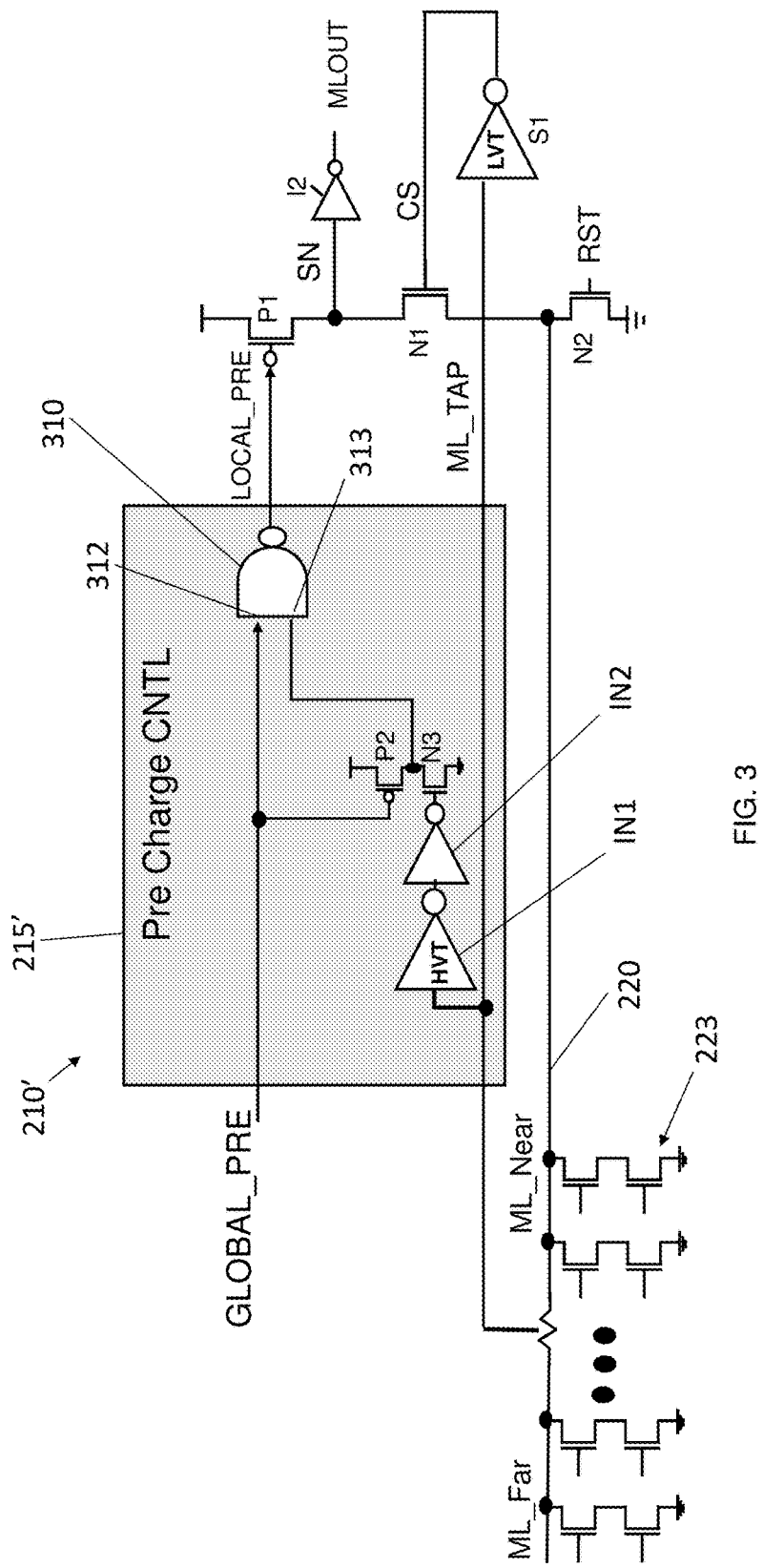
FIG. 3 shows a sense amplifier and a matchline in accordance with additional aspects of the present disclosure.

FIG. 3 shows a sense amplifier and matchline in accordance with additional aspects of the present disclosure. In particular, FIG. 3 shows an alternative local precharge controller 215' of sense amplifier 210'. The local precharge controller 215' includes a NAND gate 310 having an output connected to the gate of the pFET transistor P1. The first input 312 of the NAND gate 310 is the global precharge signal GLOBAL_PRE and the second input 313 of the NAND gate 310 indicates the state of the matchline 220 and the feedback line ML_TAP.

The local precharge controller 215' also includes a local pFET P2 and a local nFET N3 disposed in series between VDD and GND, with the pFET P2 between VDD and the nFET N3 and the nFET N3 between the pFET P2 and the GND. The second input 313 of the NAND gate 310 is connected between the pFET P2 and the nFET N3. The gate of the pFET P2 is connected to the global precharge signal GLOBAL_PRE. The gate of the nFET N2 is connected to the feedback line ML_TAP via a number of inverters IN1 and IN2. In embodiments, inverter IN1 has a threshold higher than a threshold of the inverter S1 to allow for the matchline 220 to charge to a voltage high enough to identify matches and mismatches at the far end ML_Far of the matchline 220. As previously described, the threshold of the inverter S1 and the location of the connection of the feedback line ML_TAP to the matchline 220 allow the matchline 220 to charge long enough to provide sufficient current for the operation of the far end ML_Far of the matchline 220.

The feedback line ML_TAP is connected to the inverter IN1 of the local precharge controller 215' to provide a signal to the second input 313 of the NAND gate 310. At least one of the inverters IN1 and IN2, and more preferable, the inverter IN1, has a threshold higher than the threshold of the inverter S1 so as to ensure that the inverter S1 of the sense amplifier 210' trips before the precharge shutoff occurs. After the inverter S1 trips and the nFET N1 is closed, the charges distribute along the matchline 220, from the near end ML_Near to the far end ML_Far of the matchline 220, and the feedback line ML_TAP such that the higher threshold of the at least one inverter IN1 and IN2 is met. Upon meeting of the higher threshold of the at least one inverter IN1 and IN2, the nFET transistor N3 is turned on to take the second input 313 of the NAND gate 310 to ground resulting in the NAND gate 310 outputting a high LOCALPRE and closing the pFET transistor P1, thereby locally ending the precharge mode for the individual matchline 220. The evaluate mode of the matchline 220 may then operate as described herein.

Figure 4:
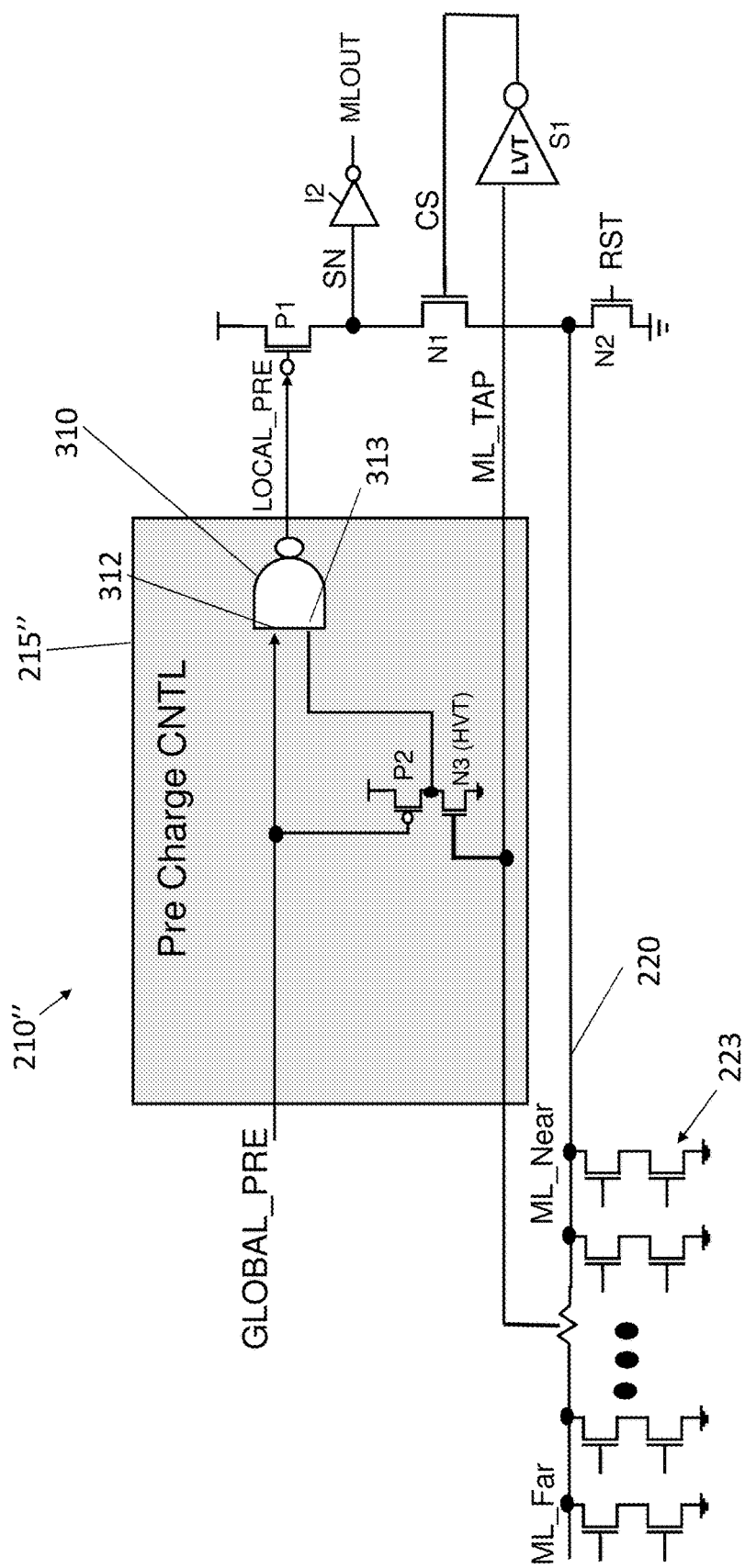
FIG. 4 shows a sense amplifier and a matchline in accordance with additional aspects of the present disclosure.

FIG. 4 shows a sense amplifier and matchline in accordance with an additional aspect of the present disclosure. As described herein, the precharge of the matchline 220 is controlled locally by sense amplifier 210" which includes the local precharge controller 215" outputting the LOCAL-PRE control signal.

In this embodiment, the local precharge controller 215" does not include inverters. More specifically, the local precharge controller 215" includes a NAND gate 310 having an output connected to the gate of the pFET transistor P1. The first input 312 of the NAND gate 310 is the global precharge signal GLOBAL_PRE and the second input 313 of the NAND gate 310 indicates the state of the matchline 220 and the feedback line ML_TAP.

The local precharge controller 215" also includes a local pFET P2 and a local nFET N3 disposed in series between VDD and GND, with the pFET P2 between VDD and the nFET N3 and the nFET N3 between the pFET P2 and the GND. The second input 313 of the NAND gate 310 is connected between the pFET P2 and the nFET N3. The gate of the pFET P2 is connected to the global precharge signal GLOBAL_PRE. The gate of the nFET N2 is connected to the feedback line ML_TAP.

Here, the nFET N2 has a threshold higher than a threshold of the inverter S1 to allow for the matchline 220 to charge to a voltage high enough so that the bit comparison transistors 223 identify matches and mismatches at the far end ML_Far of the matchline 220. The threshold of the inverter S1 and the location of the connection of the feedback line ML_TAP to the matchline 220 allow the matchline 220 to charge long enough to provide sufficient current for the operation of the far end ML_Far of the matchline 220.

The feedback line ML_TAP is connected to the gate of the nFET transistor N3 of the local precharge controller 215" to provide a signal to the second input 313 of the NAND gate 310. The nFET transistor N3 has a threshold higher than the threshold of the inverter S1 so as to ensure that the inverter S1 of the sense amplifier trips before the precharge shutoff occurs. After the inverter S1 trips and the nFET N1 is closed, the charges distribute along the matchline 220, from the near end ML_Near to the far end ML_Far of the matchline 220, and the feedback line ML_TAP such that the higher threshold of the nFET transistor N3 is met. Upon meeting of the higher threshold of the nFET transistor N3, the nFET transistor N3 is turned on to take the second input 313 of the NAND gate 310 to ground resulting in the NAND gate 310 outputting a high LOCALPRE and closing the pFET transistor P1, thereby locally ending the precharge mode for the individual matchline. The evaluate mode of the matchline 220 may then operate as described herein.

Figure 5:
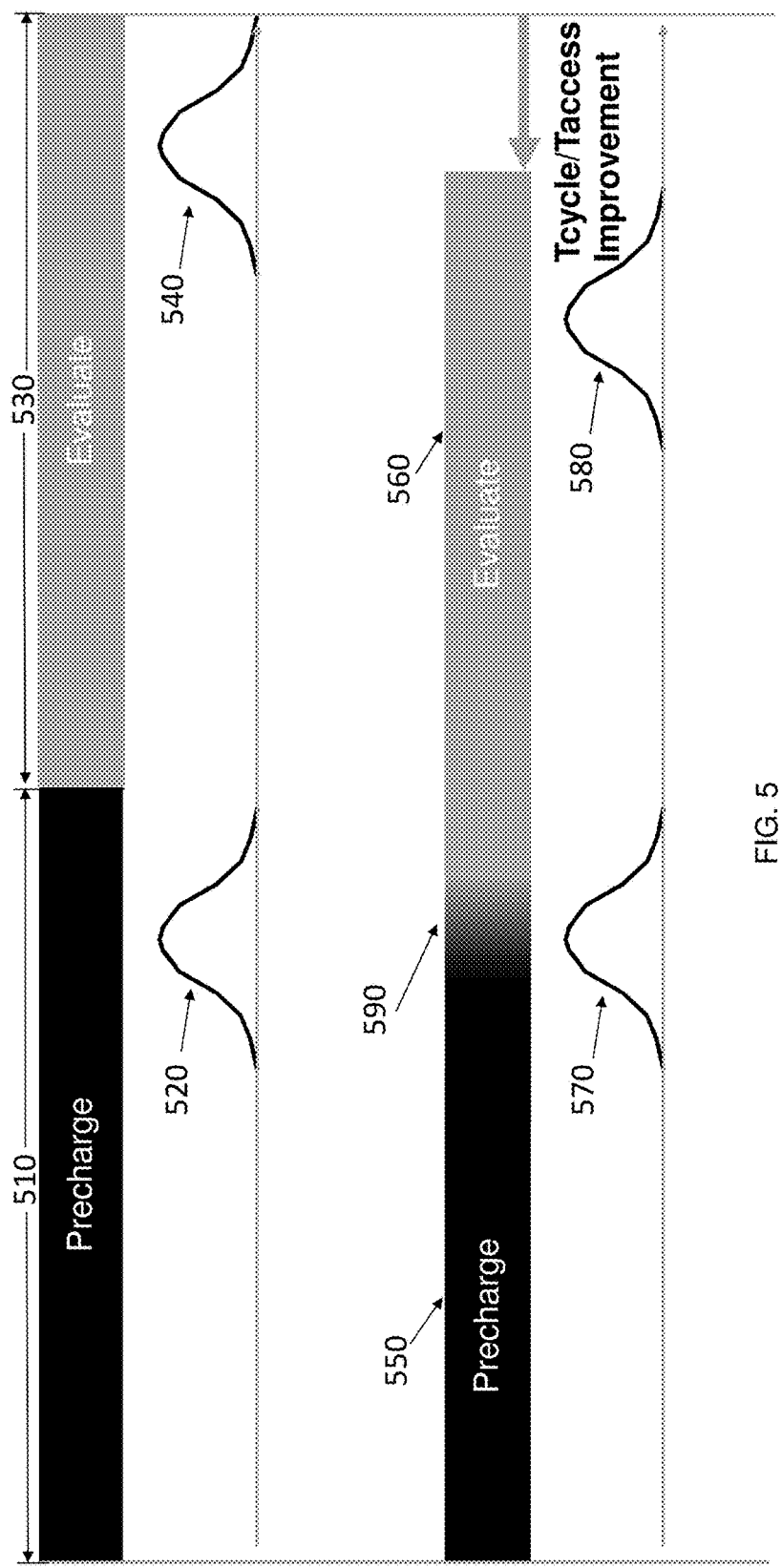
FIG. 5 shows a decreased Tcycle/Taccess in accordance with aspects of the present disclosure.

FIG. 5 shows a decreased Tcycle/Taccess in accordance with the present disclosure. During a precharge mode, a global controller applies a precharge reference voltage to the gate of an isolation field effect transistor, and the matchlines begin to precharge. For CAMs, the matchline precharge is based on a reference or Dummy ML precharge time plus a fixed logic delay. The fixed logic delay may account for random device variation, for example, variable metal resistance and capacitance, which results in near-to-far matchline precharge time variation. Consequently, the precharge time is fixed with no ability to adjust for sense amplifier to sense amplifier precharge time variations and no ability to sense and compensate for the random device variation. Therefore, the circuits are overdesigned and the evaluate mode is delayed.

For example, the global controller may output a global signal according to a time to capture both 5 sigma precharge and 5 sigma evaluation entries according to Tcycle=mean_pre+mean_eval+5*sigma_pre+5*sigma_eval. In other words, the global precharge signal is applied during a fixed duration of the precharge mode long enough to ensure that each of the matchlines is sufficiently charged to accurately perform a search of the CAM. As shown in FIG. 5, the precharge time of the precharge mode 510 is fixed and of sufficient duration to allow for each of the matchlines to precharge as indicated by the curve 520 representing the number of matchlines precharging. The global precharge signal is applied for the entirety of the precharge mode 510 and turned off to begin the evaluate mode 530. The evaluate time of the evaluate mode 530 is also fixed and begins after the completion of the precharge mode 510. And, each of the matchlines is evaluated in the evaluate mode 530 as indicated by curve 540 representing the number of matchlines being evaluated.

As shown in FIG. 5, the precharge mode 550 is dynamic in that the evaluate mode 560 begins for each matchline upon completion of that matchline's own, local precharge, effectively eliminating the need for the built-in delay of the precharge mode 510. The evaluate mode 560 begins for each matchline that is precharged upon completion of the precharge. For example, curve 570 represents a number of matchlines precharged and ready for evaluation. In the evaluate mode 560, each of the matchlines is evaluated as indicated by curve 580. As shown in FIG. 5, the evaluation of the matchlines occurs earlier in evaluate mode 560 relative to the evaluate mode 530 due to the feedback of the state of charge of the matchline and location precharge control.

The location of the tap point may be provided according to technology dependent parameters, such as metal resistance and capacitance, and may be provided between one end of the matchline and the sense amplifier. For example, the location of the tap point may be provided at about ⅓ to about ½ the ML length from a connected end of the matchline.

The searchable CAM structure of the present disclosure can be manufactured in a number of ways using a number of different tools. In general, though, the methodologies and tools are used to form structures with dimensions in the micrometer and nanometer scale. The methodologies, i.e., technologies, employed to manufacture the searchable CAM structure of the present disclosure have been adopted from integrated circuit (IC) technology. For example, the structures are built on wafers and are realized in films of material patterned by photolithographic processes on the top of a wafer. In particular, the fabrication of the searchable CAM structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a sense line connected to a sensing device;
   a feedback line connected to the sense line at a tap point between a first end and a second end of the sense line; and
   a local precharge controller connected to the tap point by the feedback line to control precharging of the sense line according to a state of the feedback line.

2. The structure of claim 1, wherein the sensing device further comprises an inverter connected to the tap point by the feedback line.

3. The structure of claim 2, wherein:
   the sensing device has a threshold, and, when a charge state of the feedback line reaches the threshold of the sensing device, the inverter turns off the precharging of the sense line; and
   the local precharge controller has a threshold, and, when a charge state of the feedback line reaches the threshold of the local precharge controller, the local precharge controller turns off access to a voltage source.

4. The structure of claim 3, wherein the threshold of the local precharge controller is greater than the threshold of the sensing device.

5. The structure of claim 2, wherein the local precharge controller comprises an inverter having a threshold higher than a threshold of the inverter of the sensing device.

6. The structure of claim 2, wherein the local precharge controller comprises a switch having a threshold higher than a threshold of the inverter of the sensing device.

7. The structure of claim 1, wherein the local precharge controller turns off the precharging of the matchline before a global precharge signal received by the sensing device is ended.

8. A structure, comprising:
   a global controller to output a global precharge signal;
   a matchline connected to bit comparison transistors; and
   a sense amplifier connected to the global controller and the matchline, the sense amplifier comprising a local precharge controller configured to locally precharge the matchline.

9. The structure of claim 8, further comprising a feedback line connected to the matchline at a tap point between a first end of the matchline and a second end of the matchline to indicate a charge state of the individual matchline for local precharge control by the local precharge controller.

10. The structure of claim 9, wherein the feedback line is connected to the local precharge controller, and the local precharge controller stops the precharge of a sense-line or the matchline according to a state of charge of the feedback line.

11. The structure of claim 10, wherein the first end of the matchline is connected to the sense amplifier, and the tap point is about ⅓ to about ½ of the length of the matchline from the first end of the matchline.

12. The structure of claim 10, wherein the sense amplifier further comprises an inverter connected to the feedback line, and the sense amplifier turns off charging of the matchline according to a state of charge of the feedback line.

13. The structure of claim 12, wherein the local precharge controller comprises an inverter having a threshold higher than a threshold of the inverter of the sense amplifier.

14. The structure of claim 12, wherein the local precharge controller comprises a switch having a threshold higher than a threshold of the inverter of the sense amplifier.

15. A method for determining a match or a mismatch on a matchline, the method comprising:
   precharging a matchline connected to a sense amplifier; and
   turning off the precharging of the matchline according to a charge state of a feedback line connected to the matchline.

16. The method of claim 15, wherein the matchline is precharged to a threshold of an inverter connected to the matchline by the feedback line.

17. The method of claim 16, wherein, upon reaching the threshold, the inverter turns off access of the matchline to a voltage source.

18. The method of claim 16, wherein, upon reaching the threshold, the charge on the matchline distributes along the matchline to reach a threshold at a tap point, the tap point being located between a first end and a second end of the matchline, to turn off the precharging of the matchline.

19. The method of claim 15, wherein the charge state of the feedback line is determined at a tap point located between a first end and a second end of the matchline.

20. The method of claim 19, wherein the first end of the matchline is connected to the sense amplifier, and the tap point is about ⅓ to about ½ of the length of the matchline from the first end of the matchline.

* * * * *